(12) United States Patent
Nakamura et al.

(10) Patent No.: US 6,335,076 B1
(45) Date of Patent: Jan. 1, 2002

(54) MULTI-LAYER WIRING BOARD AND METHOD FOR MANUFACTURING THE SAME

(75) Inventors: Kei Nakamura; Masakazu Sugimoto; Yasushi Inoue; Megumu Nagasawa; Takuji Okeyui, all of Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/615,761

(22) Filed: Jul. 13, 2000

(30) Foreign Application Priority Data

Jul. 14, 1999 (JP) .................................. 11-199690

(51) Int. Cl.[7] ............... B32B 15/08; H01K 1/00
(52) U.S. Cl. ............... 428/131; 428/209; 428/337; 428/458; 428/901; 174/258; 174/259; 156/60
(58) Field of Search ..................... 428/209, 458, 428/131, 337, 901; 174/255, 257, 258, 259; 156/60, 296

(56) References Cited

U.S. PATENT DOCUMENTS 3,691,632 A * 9/1972 Smith ........................ 29/853
4,769,270 A * 9/1988 Nagamatsu et al. ......... 428/131

FOREIGN PATENT DOCUMENTS

| JP | 61-212096 | 9/1986 |
| JP | 5-259600 | 10/1993 |
| JP | 6-97665 | 4/1994 |
| JP | 6-268381 | 9/1994 |

\* cited by examiner

Primary Examiner—Deborah Jones
Assistant Examiner—Stephen Stein
(74) Attorney, Agent, or Firm—Sughrue Mion, PLLC

(57) ABSTRACT

A plurality of double-sided circuit boards 1 in which a circuit 4 is provided on either side of an insulating layer 3 comprising an organic high molecular resin with an alloy foil 2 as a basic substance, and two circuits 4 are electrically connected by a via with a soldered conductor 5a filled therein are laminated via an adhesive layer 6. The adhesive layer 6 has a bore opened at a predetermined position of a portion in direct contact with the circuits 4 of two double-sided circuit boards 1. A bore portion is provided with a soldered conductor 7. The circuits 4 of the two double-sided circuit boards 1 are electrically connected by the soldered conductor 7.

5 Claims, 12 Drawing Sheets

MULTI-LAYER WIRING BOARD AND METHOD FOR MANUFACTURING THE SAME

BACKGROUND OF THE INVENTION

1. Field of the Invention

The present invention relates to a multi-layer wiring board, and in particular to a method for manufacturing the same.

2. Description of the Related Art

As the electronic apparatuses have been reduced in size and enhanced in performance in recent years, the semiconductor devices packaged in the electronic apparatuses and the multi-layer wiring boards for mounting them are required to be smaller and thinner in construction with higher performance and reliability. Due to these demands, the mounting method has transferred from a pin insertion package to a surface mounting package, and recently, a mounting method called a bare chip mounting has been researched in which the semiconductor devices are directly packaged on the printed circuit board. With the advent of multi-pin semiconductor devices, there is an increasing need for having a multi-layer substrate for mounting the semiconductor devices. For this multi-layer substrate, a built-up method of laying an insulating layer made of a photosensitive resin and a conductor layer which is formed by plating or deposition alternately on one side or both sides of the substrate has been proposed. However, a multi-layer wiring board of the built-up method involves a complex manufacturing process, with numerous steps, resulting in a problem of having low yield and taking more time for delivery. Also, a multi-layer method has been proposed (JP-A-8-288649) in which a glass epoxy laminate with one-sided copper has a projection of an electrically conductive paste formed on one face (copper face) by a dispenser, and an adhesive sheet and a copper foil are laid one on top of another and pressed, this process being repeated to make the multi-layer. However, this method is arguable in respect of the reliability of connection and the connection resistance, difficult to apply to the fine circuit, and for the multi-layer, required to repeat the press by the number of layers, taking more time to manufacture.

On the other hand, in the bare chip mounting, a silicone chip having a thermal expansion coefficient of 3 to 4 ppm/° C. is directly bonded on a printed circuit board having a thermal expansion coefficient of 10 to 20 ppm/° C. directly via an adhesive. Accordingly, a stress is applied due to a difference in thermal expansion coefficient between them, resulting in a problem that the connection reliability is lower. Also, the stress causes a problem of producing a crack in the adhesive to reduce the moisture proof. To relieve such stress, the stress may be diffused by providing the adhesive of lower elasticity. But with any of these methods, the connection reliability can not be fully secured. Further, to secure higher reliability of connection, it is indispensable to reduce the thermal expansion coefficient of the substrate.

In such an environment, the present inventors have proposed a multi-layer wiring board and a method for manufacturing the same, comprising a plurality of low thermal expansion double-sided circuit boards in which a wiring conductor is provided on either side of an insulating layer comprising an organic high molecular resin with a metal core as a basic substance, and the wiring conductors on both sides of the insulating layer are electrically connected via a through hole, these double-sided circuit boards being laminated as one piece via an adhesive layer (Japanese Patent Application No. 9-260201).

However, in the plurality of double-sided circuit boards for the multi-layer wiring board as described above, the through hole for electrically connecting the wiring conductors on the both sides of the insulating layer has a problem of producing a crack inside or at the corner portion of the through hole, as found in an environmental accelerated test such as a temperature cycle test. Therefore, the thickness of plating the through hole may be increased to enhance the reliability. But in this case, the refined wiring can not be provided in a circuit formation process by etching. On the other hand, to form the refined wiring, it is required to reduce the thickness of a conductor layer on both sides, but resulting in lower reliability of the through hole. And in a process in which the plurality of double-sided circuit boards are laminated via the adhesive layer as one piece, the wiring conductors on two double-sided circuit boards adjacent (piled) are electrically connected via a soldered electric conductor. However, because the soldered electric conductor can not be provided on the through hole of the double-sided circuit boards, the degree of freedom of wiring is largely hindered.

SUMMARY OF THE INVENTION

The present invention has been achieved in the light of the above-mentioned drawbacks, and its object is to provide a multi-layer wiring board having an extremely small thermal expansion coefficient, a high connection reliability and a great degree of freedom, and a method for manufacturing the same.

In order to achieve the above object, according to a first aspect of the present invention, there is provided a multi-layer wiring board, comprising a plurality of double-sided circuit boards in which wiring conductors are provided on both sides of an insulating layer comprising an organic high molecular resin with a metal core as a basic substance, and are electrically connected via a via hole having a low melting point metal filled therein, the plurality of double-sided circuit boards being laminated as one piece via an adhesive layer, said adhesive layer having a bore opened at a predetermined position of a portion in direct contact with the wiring conductors of two double-sided circuit boards, said bore portion being provided with a soldered electric conductor, in which said two double-sided circuit boards are electrically connected by said soldered electric conductor.

According to a second aspect of the invention, there is provided a method for manufacturing a multi-layer wiring board, including the steps of preparing a plurality of double-sided circuit boards in which wiring conductors are provided on both sides of an insulating layer comprising an organic high molecular resin with a metal core as a basic substance, and are electrically connected via a via hole having a low melting point metal filled therein, and an adhesive sheet having a bore opened at a predetermined position of a portion in direct contact with said wiring conductors of said double-sided circuit boards, bonding temporarily said adhesive sheet to said double-sided circuit boards in a state where a bore portion of said adhesive sheet is registered with respect to a predetermined portion of the wiring conductors provided on said double-sided circuit boards, forming a solder bump by filling a solder paste into the bore portion of each adhesive sheet by printing and fusing the solder paste by heating after bonding temporarily said adhesive sheet, and laminating said double-sided circuit boards as one piece and applying pressure and heat on said double-sided circuit boards, with the wiring conductors of said double-sided circuit boards being positioned to enable the predetermined electrical connections, after forming said solder bump.

The present inventors have made a series of researches to obtain a multi-layer wiring board having an extremely small thermal expansion coefficient, a high connection reliability and a great degree of freedom of wiring. As a result, the inventors have found that a multi-layer wiring board having an extremely small thermal expansion coefficient, a high connection reliability and a large degree of freedom of wiring can be fabricated by electrically connecting the wiring conductors on both sides through a via hole having a low melting point metal filled therein with a metal core as a basic substance, and have attained the present invention. In the multi-layer wiringboard of the present invention, it is possible to obtain a low thermal expansion double-sided circuit board by having the metal core as the basic substance. By laminating the low thermal expansion double-sided circuit boards integrally, it is possible to obtain a low thermal expansion multi-layer wiring board. Also, in the multi-layer wiring board of the present invention, a via hole with a low melting point metal filled therein may be provided, instead of the through hole. With this, there occurs no crack inside or at the corner of the hole in an environmental accelerated test such as a temperature cycle test, resulting in high connection reliability. By providing a soldered electric conductor on the via hole with low melting point metal filled therein, the wiring conductors of two double-sided circuit boards piled (adjacent up and down) can be electrically connected, resulting in a greater degree of freedom. On the other hand, a manufacturing method of the present invention comprises bonding temporarily an adhesive sheet on the double-sided circuit board in registration, forming a solder bump on a bore portion in this adhesive sheet, laminating the double-sided circuit boards in registration, and applying heat and pressure on the laminated double-sided circuit boards to integrate them. Therefore, a plurality of double-sided circuit boards can be integrated by application of heat and pressure at a time. At the same time, whatever the number of wiring conductor layers may be, the wiring conductors can be electrically connected by the application of heat and pressure at a time. In the present invention, a phrase "preparing an adhesive sheet bored at a position corresponding to a predetermined portion of each of the wiring conductors on the double-sided circuit board" means including an instance of boring after laying the adhesive sheet on the double-sided circuit board.

In the present invention, fabrication of the double-sided circuit boards may further comprise the steps of preparing a substrate having a conductor layer on both sides of an insulating layer comprising an organic high molecular resin with a metal core as a basic substance, and a bore at a predetermined position of the metal core, providing a through hole which is smaller than the bore at a portion of the substrate corresponding to the bore, filling a low melting point metal into the though hole, connecting electrically the conductor layers on the both faces of the substrate via the low melting point metal by plating both faces of the substrate after filling, and forming a circuit on the conductor layers on the both faces after plating. Thereby, the conductor layers on the both sides can be electrically connected by directly plating the low melting point metal filled into the through hole of the substrate, thereby making the conductor layer thinner.

Figure 1:
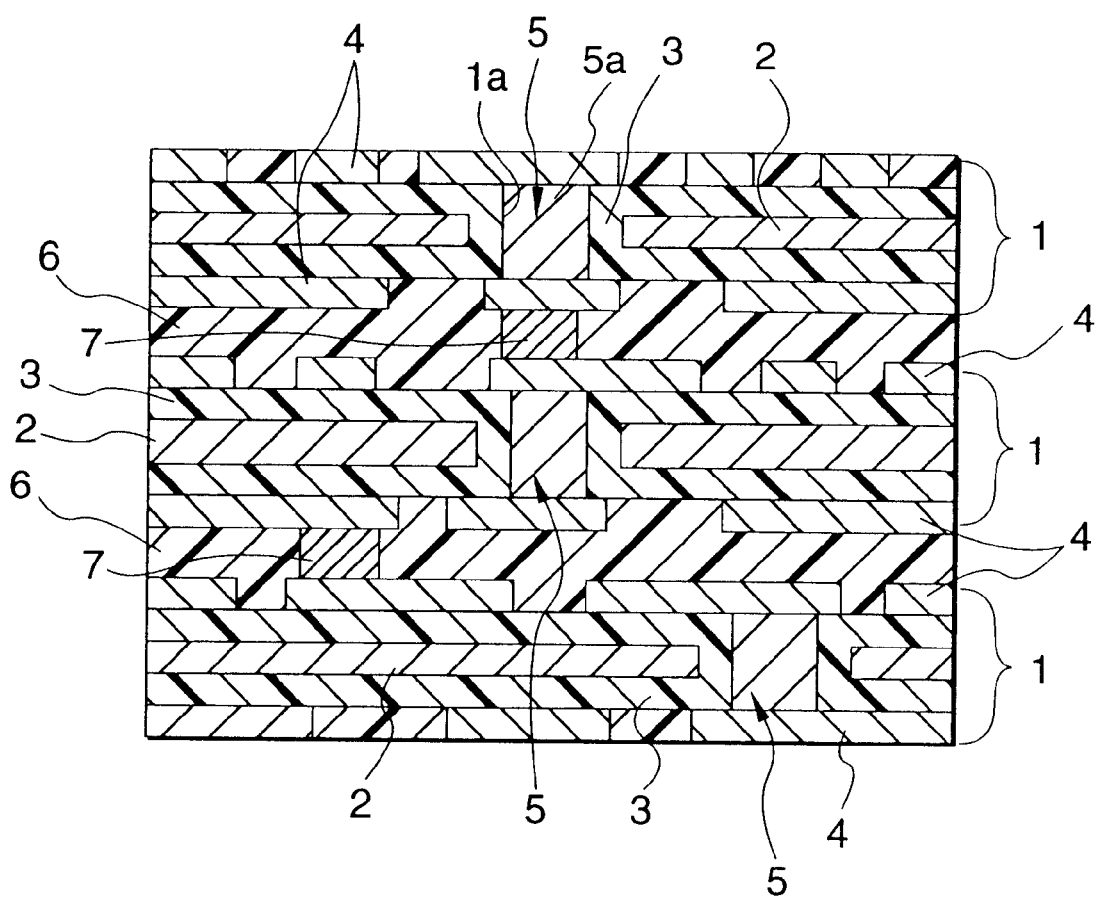
FIG. 1 is a cross-sectional view showing one embodiment of a multi-layer wiring board according to the present invention.

In the present specification, 1 denotes a double-sided circuit board, 2 denotes an alloy foil, 3 denotes an insulating layer, 4 denotes a circuit, 5a or 7 denotes a soldered conductor, and 6 denotes a n adhesive layer.

DETAILED DESCRIPTION OF THE INVENTION

The present invention will be described below in detail.

In a double-sided circuit board constituting a multi-layer wiring board of the present invention, the organic high molecular material for use as an insulating layer is suitably, but not limited to, polyimide resin, and may be polyeter imide, polyeter sulphone, or epoxy resin. The metal material constituting the wiring conductors on the both sides of the insulating layer is suitably, but not limited to, copper, and may be gold or silver.

Means for opening a via hole (through hole) in the insulating layer may be a suitable method, depending on the size of hole, including drill, punch and laser. The low melting point metal for filling the through hole may be a soldered electric conductor selected from among Sn, Pb, Ag, Bi, Zn, Sb and Cu. The soldered electric conductor is for example, but not limited to, a solder composition such as Sn—Pb, Sn—Ag, Sn—Sb, Sn—Bi, Sn—Ag—Bi, Sn—Zn and Sn—Cu, and may be determined optimally in accordance with the heat resistance required for the substrate.

In filling the low melting point metal into the through hole, this low melting point metal may be filled to extend over the entire space of the through hole. A way of filling the low melting point metal may include, for example, introducing a low melting point metal powder, or a mixture of the low melting point metal powder and an organic agent which is like a paste, as required, from one side of the double-sided substrate, by squeezing, or introducing the low melting point metal by press from the upper face after printing an excess amount of low melting point metal material on the upper portion of the though hole. Further, the filling can be secured by application of heat and pressure at a temperature above a melting point. The excess amount of low melting point metal may be removed, as required, by polishing the both sides of the double-sided substrate.

A circuit formation on the double-sided substrate with the low melting point metal filled into the through hole may be performed by electrolytic plating and patterning. The thickness of a circuit layer is set to be 36 $\mu$m or less, preferably 18 $\mu$m or less. Outside this range, the refined circuit wiring is difficult. After patterning, the circuit layer is joined with the metal by application of heat and pressure at a temperature above the melting point of the low melting point metal to secure the electrical connection. After providing a through hole in the adhesive layer beforehand and filling the low melting point metal therein, the patterning may be made by pasting a copper foil on either side of this adhesive layer. Or after the low melting point metal is filled into the adhesive layer with the through hole provided, the circuit formation may be made by combination of non-electrolytic plating, deposition and electrolytiec plating. In this way, when the low melting point metal is filled into the through hole, there is an advantage that the low melting point metal can be directly plated.

The core materials for use to realize the low thermal expansion of the substrate may include Fe, Ni, Cr, Al, Ti, Cu, Co, an alloy foil thereof, or a ceramic material. The above metal foil or ceramic material acts to suppress the expansion of the conductor layer and the insulating layer. Therefore, its own thermal expansion coefficient is required to be sufficiently small. In the case where the core material is Ni—Fe alloy foil, the content ratio of Ni (weight %) is 31 to 50 wt %, preferably 31 to 45 wt %, because the thermal expansion coefficient is varied with its ratio. Above or below this range, the thermal expansion coefficient is large, and the thermal expansion coefficient equivalent to that of the chip can not be obtained. The thickness of the metal foil is 10 to 300 $\mu$m, preferably 10 to 200 $\mu$m, more preferably 10 to 100 $\mu$m. Below this thickness, the difference in thermal expansion between the circuit board and silicone chip can not be suppressed. To make a multi-layer from the double-sided circuit board, an adhesive sheet bored at a position corresponding to the site necessary on the double-sided circuit board is registered and bonded temporarily on one face or both faces of the double-sided circuit board. A solder paste is poured into a bore portion by printing, and molten by heating to form a solder bump. A plurality of double-sided circuit boards with solder bump are registered, laid one on the other, and integrated by application of heat and pressure. Herein, the bore portion may be applied on the circuit above the via through which the wiring conductors on both sides of the double-sided circuit board are electrically connected.

The adhesive sheet becomes an insulating layer after lamination and integration. Hence, the adhesives for this adhesive layer may be preferably polyimide, epoxy or mixture thereof from the aspects of the heat resistance and the electrical characteristics. The thickness of the adhesive sheet may be about 0.01 mm to about 1.0 mm. Below this range, the workability may be low. Above this range, the solder paste can not be well filled into the bore portion, causing the reliability to be lowered. Means for opening a bore in this adhesive sheet may be a suitable method, depending on the size of bore, for example, including drill, punch or laser.

In a step of securing temporarily the adhesive sheet, the adhesive sheet having a bore may be bonded temporarily using a heat press at a certain position on one face or both faces of the low thermal expansion double-sided circuit board. Or after the adhesive sheet is temporarily bonded on one face of both faces of the double-sided circuit board, it may be bored, using a laser. The laser may be suitably carbon dioxide gas, excimer, or YAG.

In forming the solder bump, the solder paste may be commercially available, the size of solder particle being 100 $\mu$m or less, preferably 50 $\mu$m or less, more preferably 10 $\mu$m or less. The composition of solder is not specifically limited, and may be selected in accordance with the heat resistance for the substrate. The solder bump after lamination is conducted by making contact with an opposed electrode, but if required, the substrate may be heated above the melting point of the solder for the metal joining. A method of metal joining is performed at the same time while the substrate is integrated by application of heat and pressure, or may be performed by heating again after integration.

The embodiments of the present invention will be described below in detail with reference to the drawings.

FIG. 1 illustrates one embodiment of a multi-layer wiring board of the present invention. In the figure, reference numeral 1 denotes a double-sided circuit board having a circuit (wiring conductor) 4 made of a copper foil which is formed on both sides of an insulating layer 3 made of polyimide resin with a Ni—Fe alloy foil 2 as a basic substance. In this embodiment, three double-sided circuit boards 1 are used. Thereby, a six-layer wiring board is fabricated as the multi-layer wiring board. Reference numeral 5 denotes a via having a soldered electric conductor 5a filled into a through hole (via hole) 1a opened in each of the double-sided circuit boards 1, the via electrically connecting the circuits 4 on the both sides. Reference numeral 6 denotes a polyimide adhesive layer for bonding the double-sided circuit boards 1. Reference numeral 7 denotes a soldered electric conductor for electrically connecting the circuits 4 on two double-sided circuit boards 1 which are laid one on the other (adjacent up and down).

Figure 2:
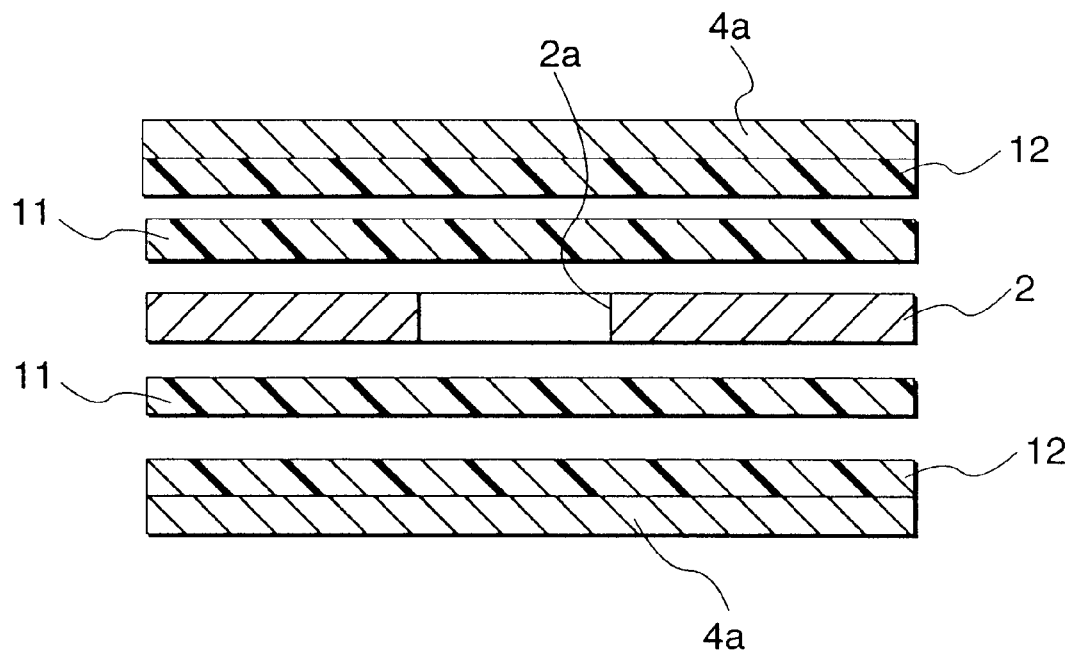
FIG. 2 is a cross-sectional view showing a manufacturing process of a double-sided circuit board.
Figure 3:
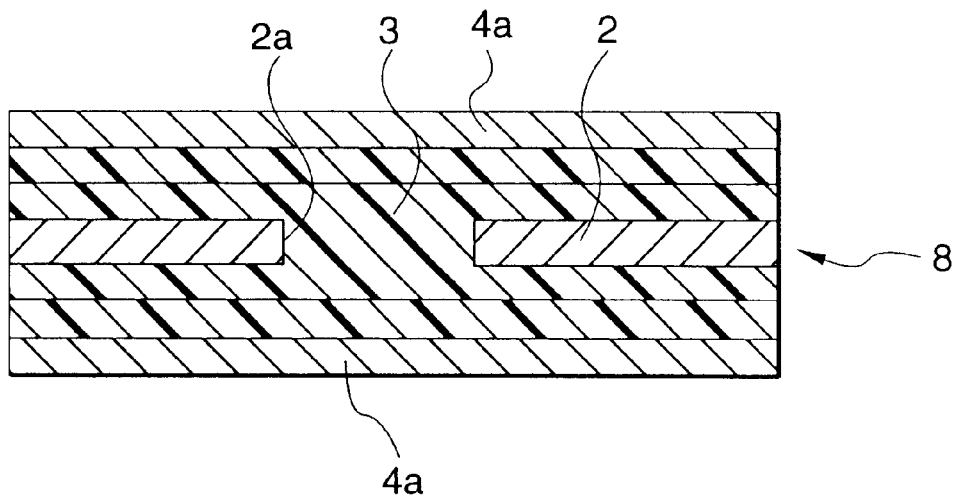
FIG. 3 is a cross-sectional view showing the manufacturing process of the double-sided circuit board.

The double-sided circuit board 1 can be manufactured in the following way. That is, a bore 2a is first opened at a predetermined position (a position for the via 5 for filling the soldered electric conductor 5a) of the Ni—Fe alloy foil 2, as shown in FIG. 2. Then, the conductor layers 4a comprising a copper foil are pasted from both sides of the Ni—Fe alloy foil 2, using a polyimide adhesive sheet 11 (which is the insulating layer 3 for a substrate 8 as will be described later). Thus, the substrate 8 is fabricated as shown in FIG. 3.

Figure 4:
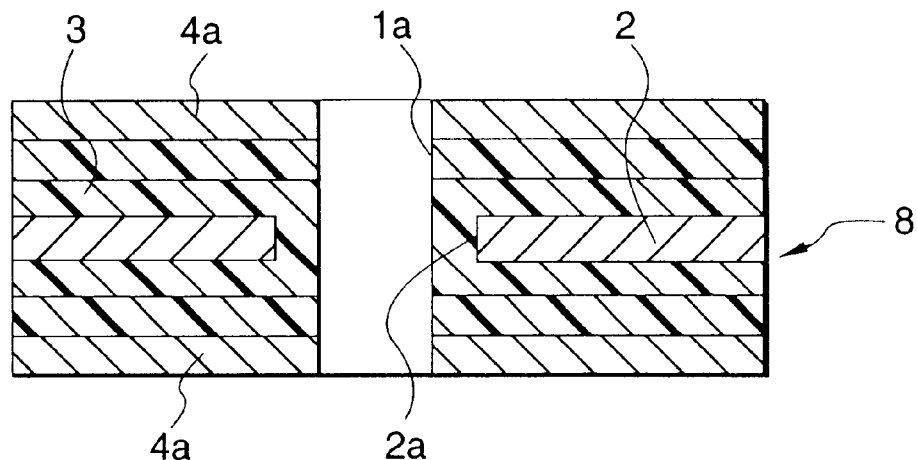
FIG. 4 is a cross-sectional view showing the manufacturing process of the double-sided circuit board.
Figure 5:
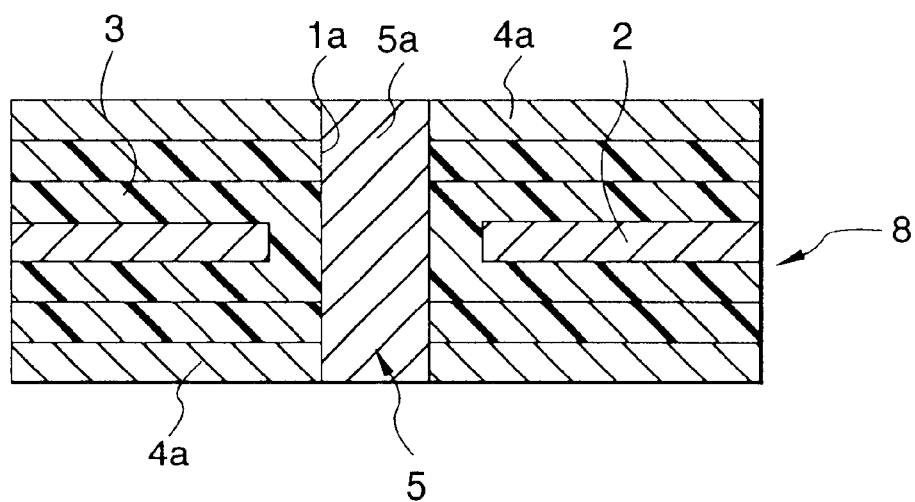
FIG. 5 is a cross-sectional view showing the manufacturing process of the double-sided circuit board.
Figure 6:
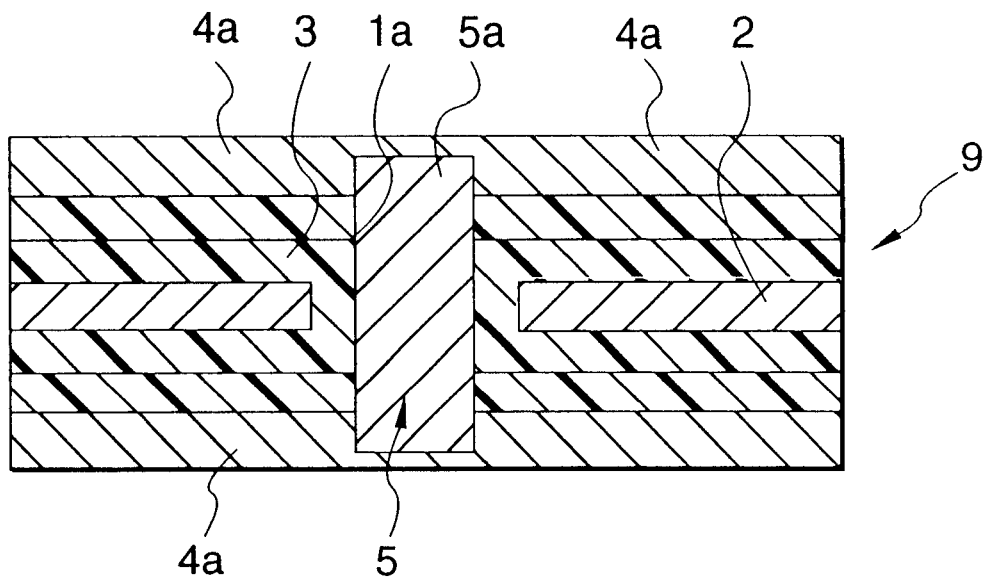
FIG. 6 is a cross-sectional view showing the manufacturing process of the double-sided circuit board.
Figure 7:
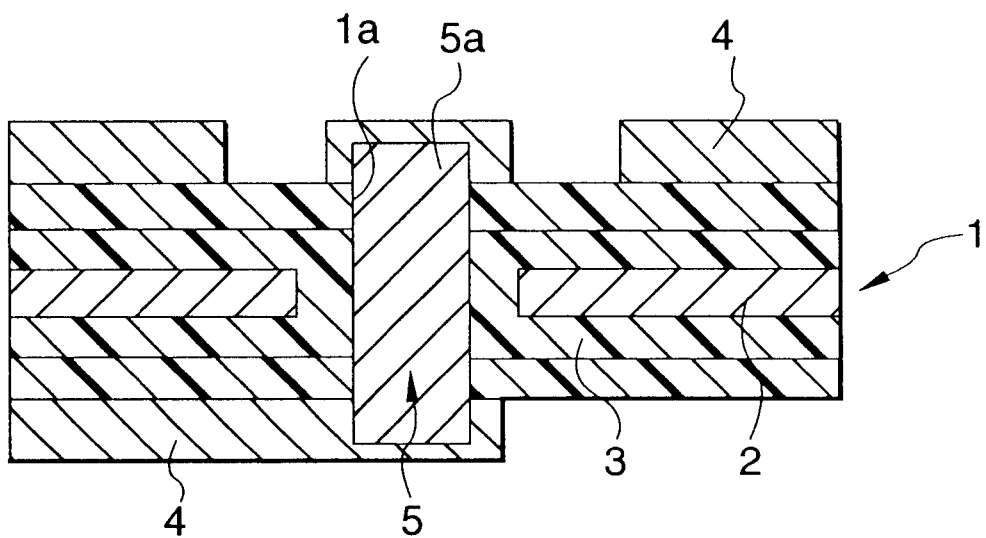
FIG. 7 is a cross-sectional view showing the manufacturing process of-the double-sided circuit board.

(Reference numeral 12 denotes a polyimide resin layer formed on one face of the conductor layer 4a in FIG. 2). Then, as shown in FIG. 4, a through hole 1a which is smaller than a bore portion 2a is provided at a portion corresponding to the bore portion 2a of the Ni—Fe alloy foil 2 of the substrate 8. Then, as shown in FIG. 5, after the soldered electric conductor 5a is filled into this though hole 1a, the conductor layers 4a on the both sides is subjected to electrolytic copper plating, to connect electrically the conductor. layers 4a on both sides (see FIG. 6). The thermal expansion coefficient of a substrate 9 obtained in this way is susceptible to that of the Ni—Fe alloy which is a material for the core, and can be adjusted by changing the ratio of Ni—Fe and the thickness of foil. Then, a circuit 4 is formed on each of the conductor layers 4a on both sides of the substrate 9, as shown in FIG. 6, to fabricate a double-sided circuit board 1 (see FIG. 7).

Figure 8:
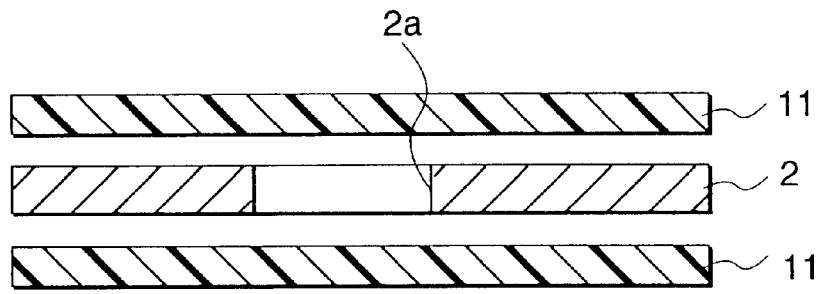
FIG. 8 is a cross-sectional view showing a manufacturing process of a variation of the double-sided circuit board.
Figure 9:
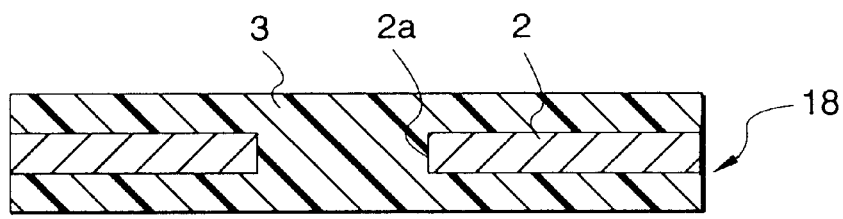
FIG. 9 is a cross-sectional view showing the manufacturing process of the variation.
Figure 10:
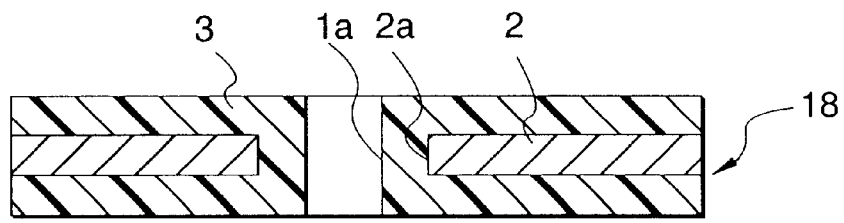
FIG. 10 is a cross-sectional view showing the manufacturing process of the variation.
Figure 11:
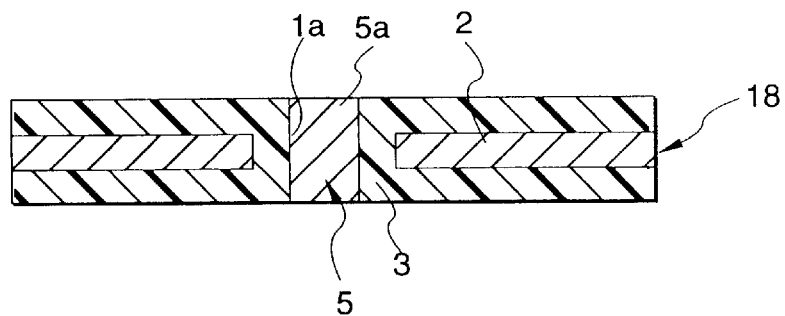
FIG. 11 is a cross-sectional view showing the manufacturing process of the variation.
Figure 12:
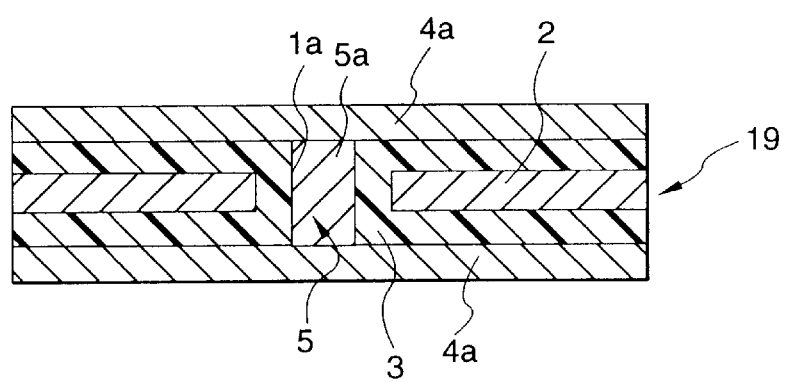
FIG. 12 is a cross-sectional view showing the manufacturing process of the variation.
Figure 13:
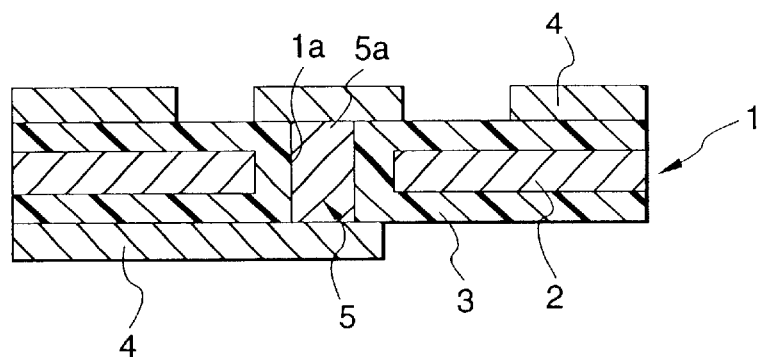
FIG. 13 is a cross-sectional view of the variation.

The double-sided circuit board 1 can be also manufactured in the following way. That is, the bore 2a is first opened at a predetermined position (a position for the via 5 for filling the soldered electric conductor 5a) of the Ni—Fe alloy foil 2, as shown in FIG. 8. Then, the polyimide adhesive sheet 11 (which is the insulating layer 3 for a substrate 18 as will be described later) is pasted from either side of the Ni—Fe alloy foil 2, to fabricate the substrate 18 as shown in FIG. 9. Then, as shown in FIG. 10, the through hole 1a which is smaller than the bore portion 2a is provided at a portion corresponding to the bore portion 2a of the Ni—Fe alloy foil 2 of the substrate 18. Then, as shown in FIG. 11, after the soldered electric conductor 5a is filled into this though hole 1a, the conductor layers 4a comprising the copper foil are pasted from both sides to connect electrically the conductor layers 4a on both sides (see FIG. 12). The substrate is subjected to application of heat and pressure above a melting point of the soldered electric conductor 5a for the secure connection. Then, the circuit 4 is formed on each of the conductor layers 4a on both sides of the substrate 19, as shown in FIG. 12, to fabricate the double-sided circuit board 1 (see FIG. 13).

Figure 14:
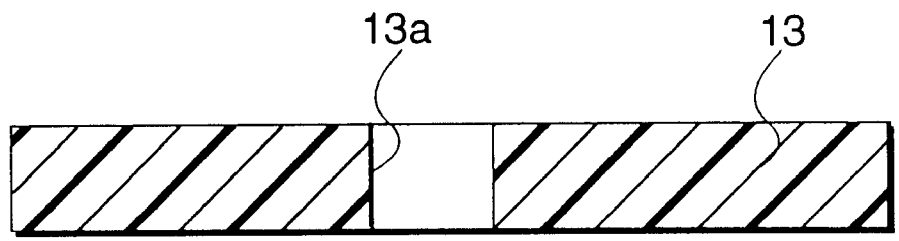
FIG. 14 is a cross-sectional view showing an adhesive sheet.
Figure 15:
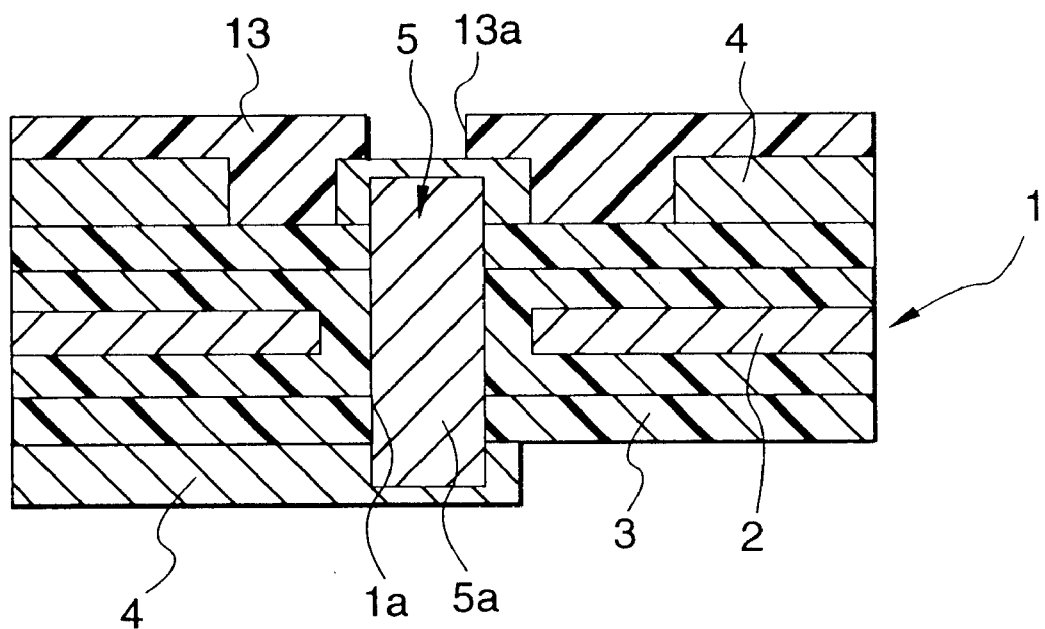
FIG. 15 is a cross-sectional view showing a state where the adhesive sheet is bonded temporarily on the double-sided circuit board.
Figure 16:
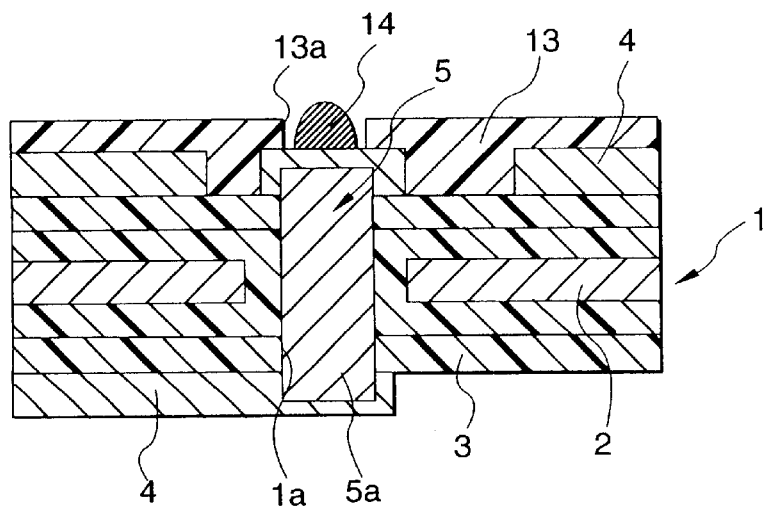
FIG. 16 is a cross-sectional view showing a state where a solder bump is formed on the adhesive sheet.
Figure 17:
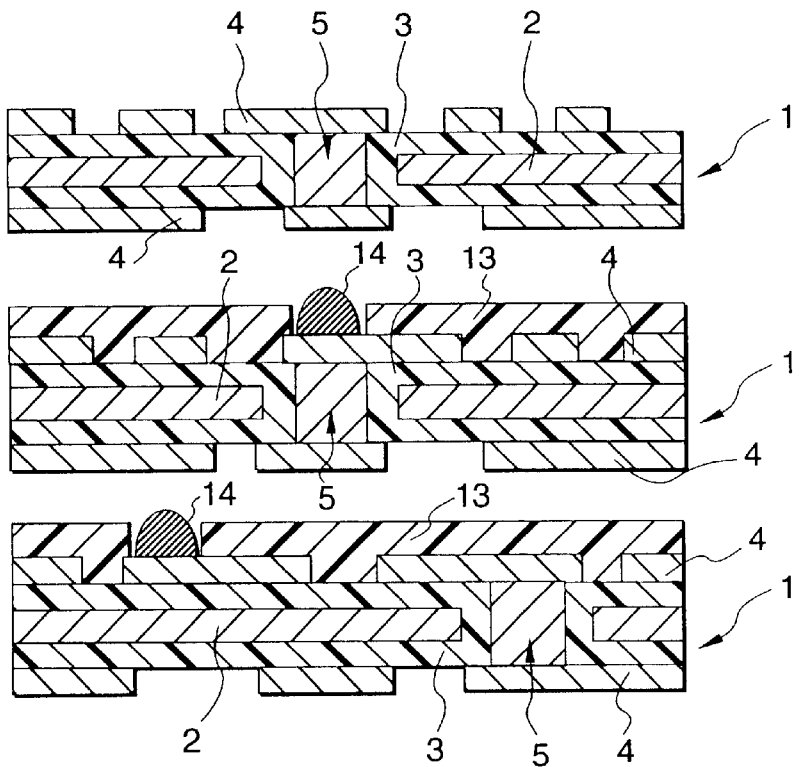
FIG. 17 is a cross-sectional view showing a state where the double-sided circuit boards are laminated.

The multi-layer wiring board can be manufactured in the following way. That is, three double-sided circuit board 1 (see FIG. 7 or FIG. 13) having the circuit 4 comprising the copper foil formed on both sides-of the insulating layer 3 made of polyimide resin, and two adhesive sheets 13 (see FIG. 14) made of polyimide adhesive are prepared. Then, as shown in FIG. 15, each adhesive sheet 13 is bonded temporarily on the upper face of two (of three) double-sided circuit boards 1, so that a bore portion 13a of each adhesive sheet 13 is registered at a predetermined position (a position for the soldered electric conductor 7 in FIG. 1) of the circuit 4 on each of the double-sided circuit boards 1. Then, as shown in FIG. 16, a solder paste is poured into the bore portion. 13a of each of the adhesive sheets 13 by screen printing and molten by heat to form the solder bump 14 on the circuit 4 of each of the double-sided circuit boards 1. Then, two double-sided circuit boards 1 provided with the solder bump 4 and one double-sided circuit board 1 simply formed with the circuit 4 are laid one on the other (see FIG. 17) in registration, and integrated by application of heat and pressure. In this state, each adhesive sheet 13 becomes the adhesive layer 6, and each solder bump 14 becomes the soldered electric conductor 7. Thereby, a six-layer wiring board having three double-sided circuit boards 1 laminated and integrated can be obtained.

As described above, in this embodiment, three double-sided circuit boards 1 can be integrated by application of heat and pressure at a time, and at the same time the electrical connection between six layers can be made. And the Ni—Fe alloy foil 2 is disposed at a ratio of one layer to two layers of the circuit 4. Therefore, when the circuit 4 is constructed by the copper foil, the thermal expansion coefficient of the overall six-layer wiring board can be reduced, leading to an extremely high reliability. Since the soldered electric conductor 5a, 7 is used for the six-layer electrical connection (electrical connection between six layers), the connection resistance is low, leading to a high reliability connection. Further, the position of junction of each soldered electric conductor 7 is not susceptible to that of the soldered electric conductor 5a of the via 5, and can be placed at any position, leading to higher degree of freedom and higher wiring density.

The effect of the invention will be presented below by way of example.

EXAMPLE 1

A copper foil 4a having a thickness of 18 $\mu$m was bonded by application of heat and pressure (40 kg/cm2, 200° C., 60 min), using a polyimide adhesive sheet 11 (manufactured by Nippon Steel Chemical: SPB-035A) having a thickness of 35 $\mu$m, on both sides of a 36 alloy foil 2 (Ni: 36 wt %, Fe: 64 wt %, thermal expansion coefficient: 1.5 ppm/° C.) having a thickness of 50 $\mu$m, with a bore 2a opened at a predetermined position at a pitch of 300 $\mu$m by a punch 150 $\mu$m in diameter, thereby fabricating a low thermal expansion double-sided circuit board 8 (see FIG. 3). Then, a through bore 1a was opened at the same position as the bore 2a of the 36 alloy foil 2, using a punch 100 $\mu$m in diameter (see FIG. 4). The upper portion of the through hole 1a was subjected to screen printing of a solder powder (with an average particle diameter of 10 $\mu$m), using a metal mask (200 $\mu$m in diameter, 100 $\mu$m in thickness), and the solder powder was fitted into it by a press (100 kg/cm2, 30° C., 5 min). Then, an excess amount of solder was removed by buffing to provide a soldered via 5 (see FIG. 5). Thereafter, it was subjected to electrolytic copper plating with a plating thickness of 10 $\mu$m (see FIG. 6). A circuit 4 was formed on the copper foil 4a on both sides by the conventional etching method to fabricate a double-sided circuit board 1 (see FIG. 7).

On the low thermal expansion double-sided circuit board 1 manufactured by the above method, a polyimide adhesive sheet 13 (manufactured by Nippon Steel Chemical: SPB-035A) (see FIG. 14) having a bore 13a opened by a punch 150 $\mu$m in diameter was laid at a predetermined position. In this state, they were bonded by application of heat and pressure (20 kg/cm2, 175° C., 30 min) (see FIG. 15). Then, a solder paste (made by Tamura Kaken: SQ10–11) was filled into the bore portion 13a of the adhesive sheet 13 by screen printing, and reflowed at a temperature of 220° C. to clean and remove the flux to fabricate a solder bump 14 (see FIG. 16). By the same method, another double-sided circuit board with the solder bump 14 and the double-sided circuit boards 1 which were made up to formation of the circuit 4 were manufactured. Then, these three double-sided circuit boards were laid one on the other in registration, and integrated by application of heat and pressure (50 kg/cm2, 175° C., 60 min) (see FIG. 17) to fabricate a low thermal expansion multi-layer wiring board of six-layer structure (see FIG. 1).

EXAMPLE 2

A copper foil 4a having a thickness of 18 $\mu$m was bonded by application of heat and pressure (40 kg/cm2, 200° C., 60 min) (see FIG. 8), using a polyimide adhesive sheet 11

(manufactured by Nippon Steel Chemical: SPB-035A) having a thickness of 35 µm, on both sides of a 36 alloy foil 2 (Ni: 36 wt %, Fe: 64 wt %, thermal expansion coefficient: 1.5 ppm/° C.) having a thickness of 50 µm, with a bore 2a opened at a predetermined position at a pitch of 300 µm by a punch 150 µm in diameter, thereby fabricating a low thermal expansion double-sided circuit board 18 (see FIG. 9). Then, a through bore 1a was opened at the same position as the bore 2a of the 36 alloy foil 2, using a punch 100 µm in diameter (see FIG. 10). The upper portion of the through hole 1a was subjected to screen printing of a solder powder (with an average particle diameter of 10 µm), using a metal mask (200 µm in diameter, 100 µm in thickness), and the solder powder was fitted into it by a press (100 kg/cm2, 30° C., 5 min). Then, an excess amount of solder was removed by buffing to provide a soldered via 5 (see FIG. 11). Then, a copper foil 4a having a thickness of 18 µm was bonded by application of heat and pressure (40 kg/cm2, 200° C., 60 min) on both sides of the low thermal expansion circuit board 18. A circuit 4 was formed on the copper foil 4a on both sides by the conventional etching method to fabricate a double-sided circuit board 1 (see FIG. 13).

Thereafter, in the same way as the example 1, an adhesive sheet 13 was bonded temporarily on the double-sided circuit board, and a solder bump 14 was then formed. The double-sided circuit board was integrated by application of heat and pressure, and the electrical connection was made between layers. As a result, a low thermal expansion multi-layer wiring board of six-layer structure was fabricated.

Comparative Example 1

Figure 18:
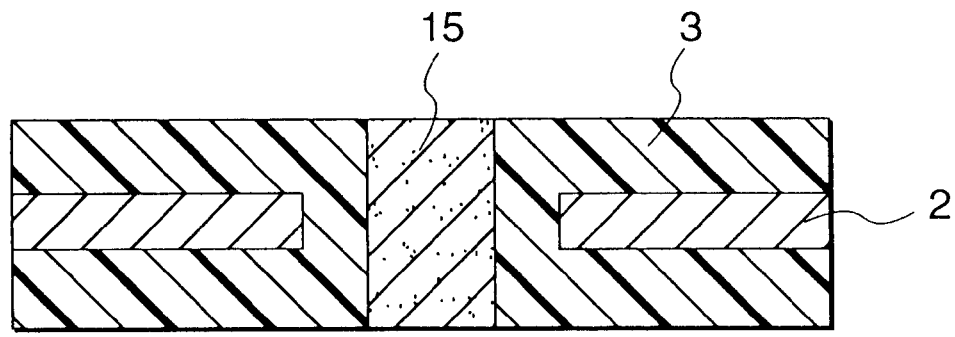
FIG. 18 is a cross-sectional view showing a manufacturing process of comparative example 1.

A polyimide adhesive sheet 11 (manufactured by Nippon Steel Chemical: SPB-035A) having a thickness of 35 µm was bonded by application of heat and pressure on both sides of a 36 alloy foil 2 (Ni: 36 wt %, Fe: 64 wt %, thermal expansion coefficient: 1.5 ppm/° C.) having a thickness of 50 µm, with a bore 2a opened at a predetermined position at a pitch of 300 µm by a punch 150 µm in diameter, thereby fabricating a low thermal expansion double-sided circuit board 18 (see FIG. 9). Then, a through bore 1a was opened at the same position as the bore 2a of the 36 alloy foil 2, using a punch 100 µm in diameter. The upper portion of the through hole 1a was subjected to screen printing of an electrically conductive paste, and cured (175° C., 60 min) to provide an electrically conductive via 15 (see FIG. 18). Herein, the electrically conductive paste was a mixture of a globular copper powder having an average particle diameter of 5 µm as an electrically conductive filler, a thermosetting epoxy resin as a resin, and an acid anhydride as a curing agent at a ratio of 85 wt %, 12.5 wt % and 2.5 wt %. Then, a copper foil 4a having a thickness of 18 µm was bonded by application of heat and pressure (40 kg/cm2, 200° C., 60 min) on both sides of the low thermal expansion circuit board. A circuit 4 was formed on the copper foil 4a on both sides by the conventional etching method to fabricate a double-sided circuit board 1.

Thereafter, in the same way as the above examples, an adhesive sheet 13 was bonded temporarily on the double-sided circuit board, and a solder bump 14 was formed. The double-sided circuit board was integrated by application of heat and pressure, and the electrical connection between layers was made. As a result, a low thermal expansion multi-layer wiring board of six-layer structure was fabricated.

Comparative Example 2

Figure 19:
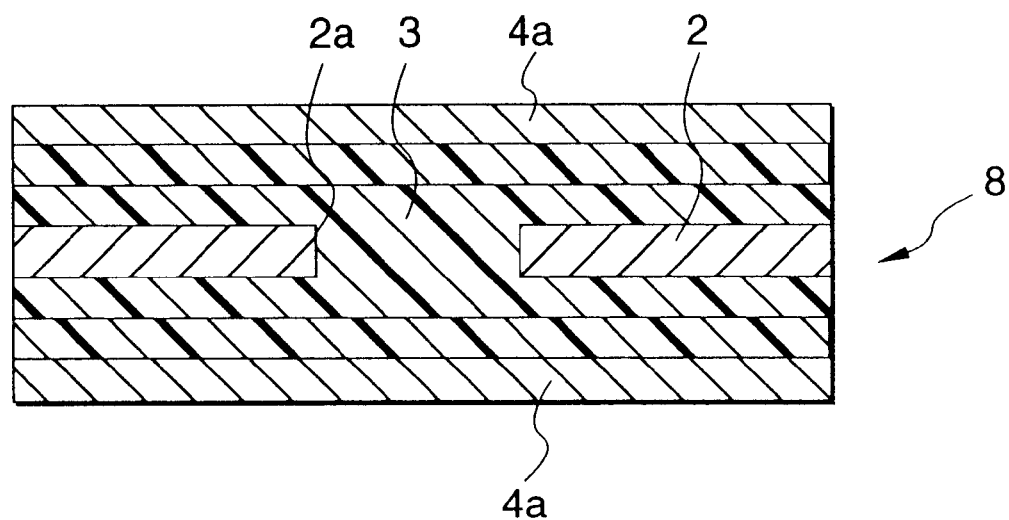
FIG. 19 is a cross-sectional view showing a manufacturing process of comparative example 2.
Figure 20:
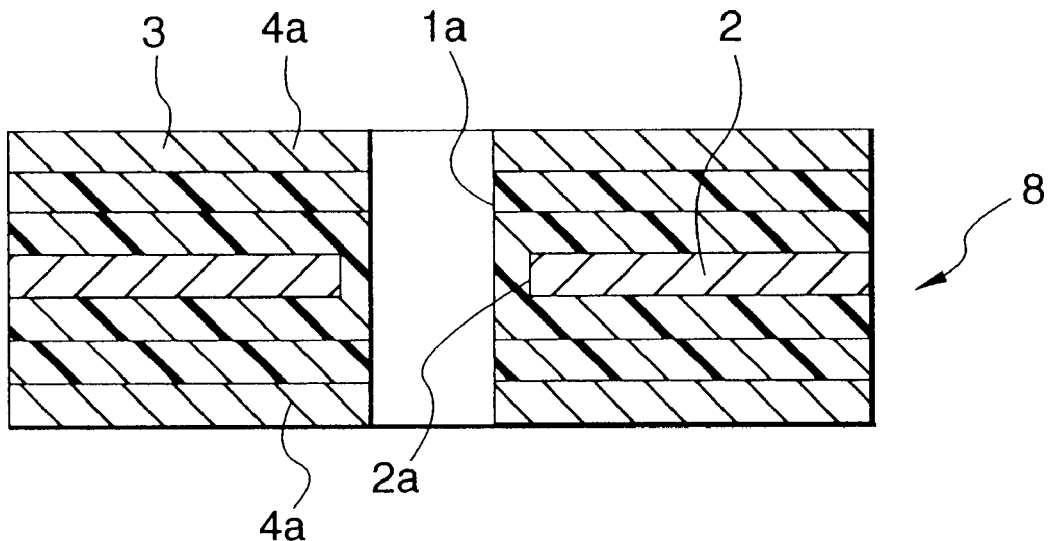
FIG. 20 is a cross-sectional view showing the manufacturing process of comparative example 2.
Figure 21:
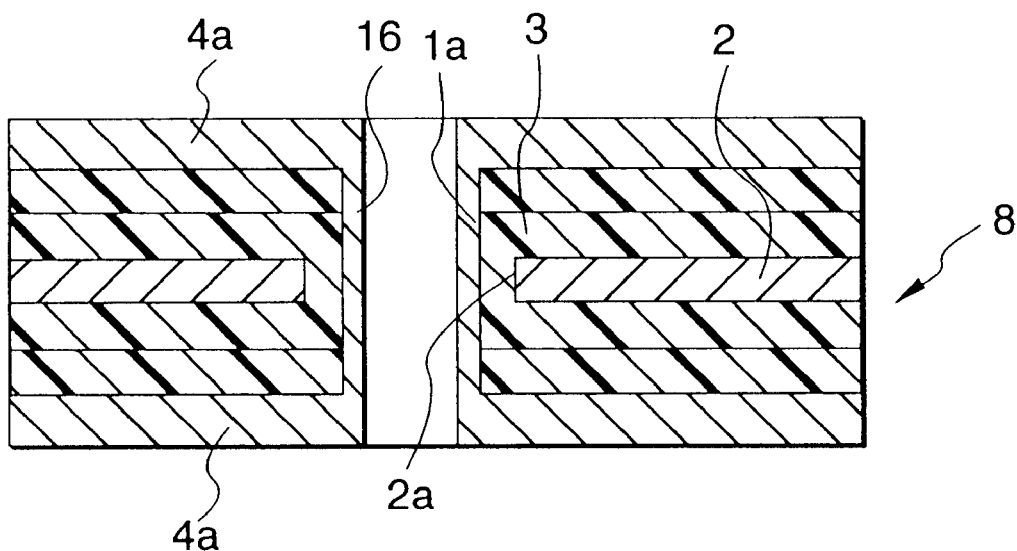
FIG. 21 is a cross-sectional view showing the manufacturing process of comparative example 2.
Figure 22:
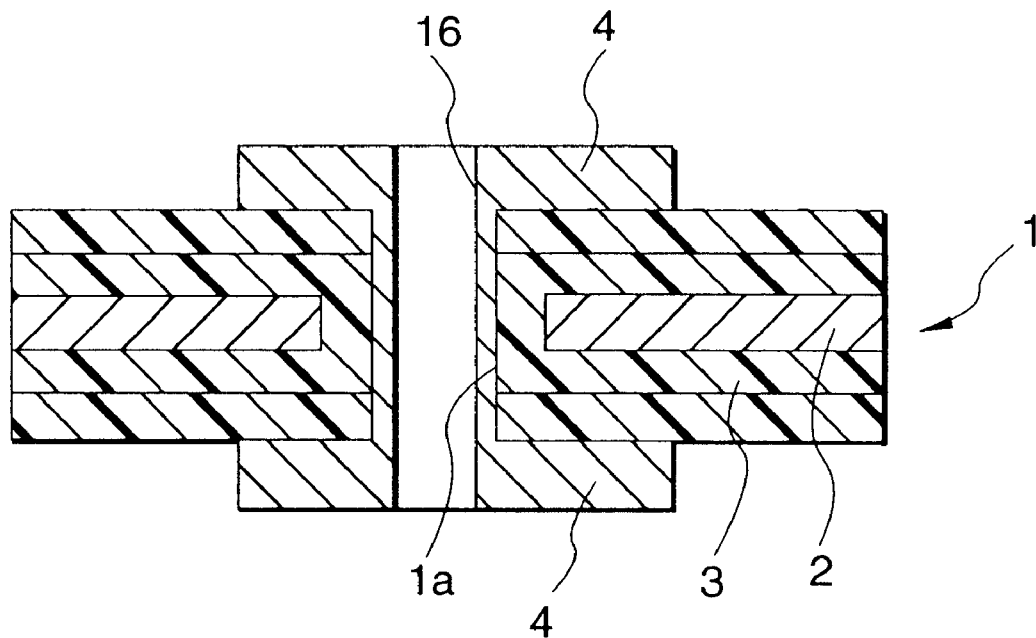
FIG. 22 is a cross-sectional view showing the manufacturing process of comparative example 2.

A copper foil 4a having a thickness of 18 µm was bonded by application of heat and pressure, using a polyimide adhesive sheet 11 (manufactured by Nippon Steel Chemical: SPB-035A) having a thickness of 35 µm, on both sides of a 36 alloy foil 2 (Ni: 36 wt %, Fe: 64 wt %, thermal expansion coefficient: 1.5 ppm/° C.) having a thickness of 50 µm, with a bore 2a opened at a predetermined position at a pitch of 300 µm by a punch 150 µm in diameter, thereby fabricating a low thermal expansion double-sided circuit board 8 (see FIG. 19). Then, a through bore 1a was opened at the same position as the bore 2a of the 36 alloy foil 2, using a punch 100 µm in diameter (see FIG. 20). Then, the through-hole was plated by copper with a thickness of plating of 10 µm (forming a through-hole plating portion 16), as shown in FIG. 21. A circuit 4 was formed on the copper foil 4a on both sides by the conventional etching method to fabricate a double-sided circuit board 1 (see FIG. 22).

Thereafter, in the same way as the above examples, an adhesive sheet 13 was bonded temporarily on the double-sided circuit board, and a solder bump 14 was formed. The double-sided circuit board was integrated by application of heat and pressure, and the electrical connection between layers was made. As a result, a low thermal expansion multi-layer wiring board of six-layer structure was fabricated.

Comparative Example 3

Figure 23:
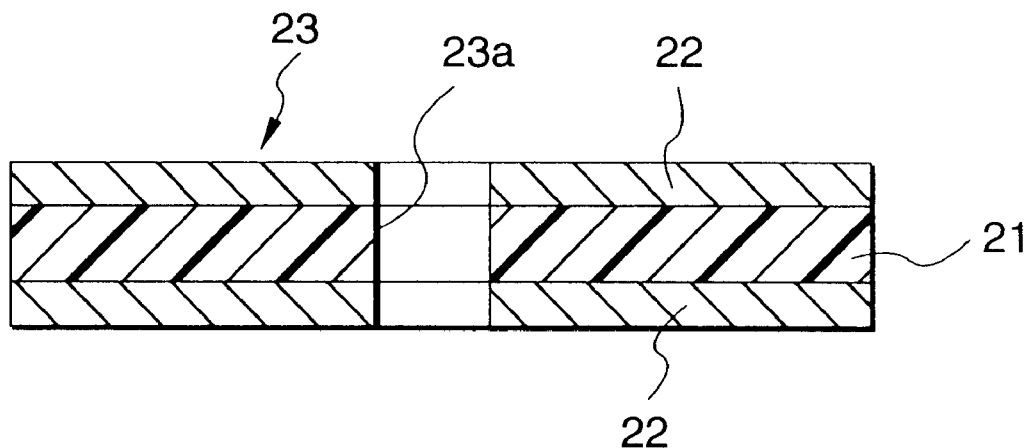
FIG. 23 is a cross-sectional view showing a manufacturing process of comparative example 3.
Figure 24:
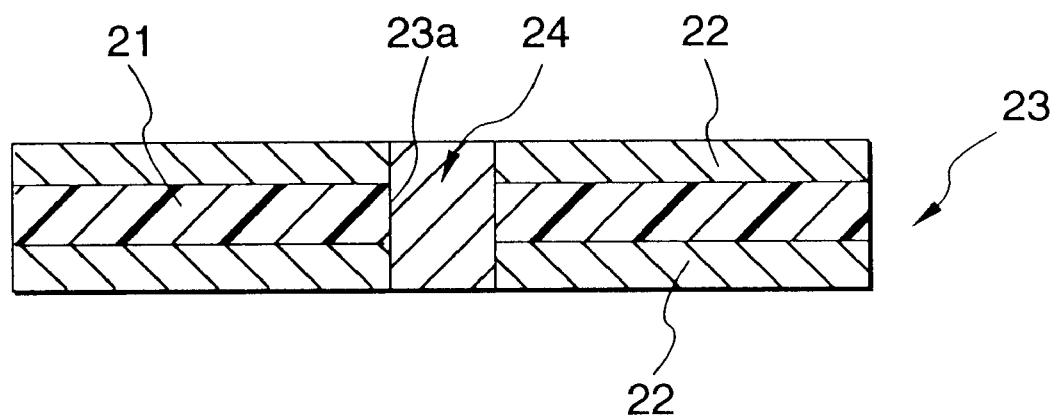
FIG. 24 is a cross-sectional view showing the manufacturing process of comparative example 3.
Figure 25:
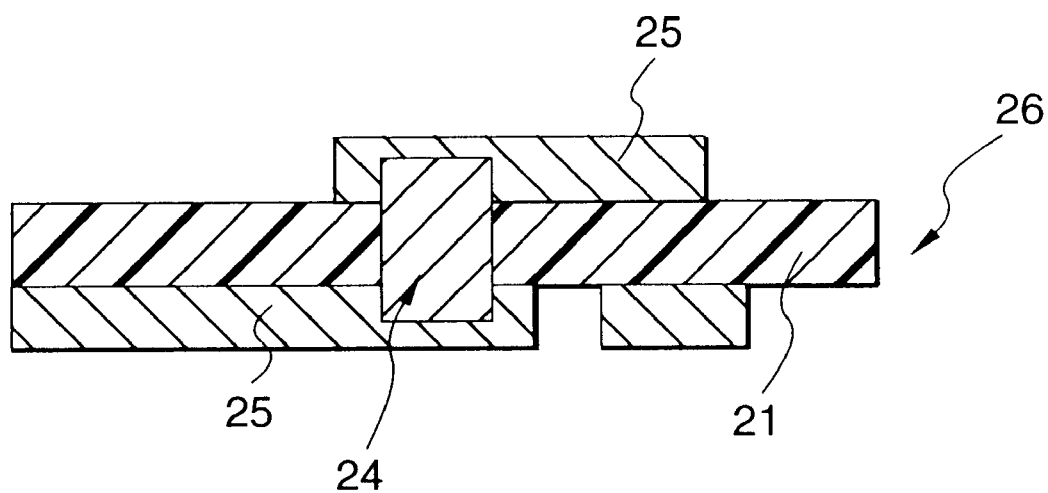
FIG. 25 is a cross-sectional view showing the manufacturing process of comparative example 3.

At a predetermined position on a double-sided copper lined polyimide substrate 23 (manufactured by Mitsui Toatu: NEOFLEX-231R) having a copper foil layer 22 (18 µm thick) provided on both sides of an insulating layer 21 (50 µm thick) comprising polyimide resin, a through hole 23a was opened by a punch 100 µm in diameter (see FIG. 23). Then, in the same way as the above examples, a soldered via 24 was provided (see FIG. 24), and then plated. A circuit 25 was formed to fabricate a double-sided circuit board 26 (see FIG. 25). Then, in the same way as the above examples, an adhesive sheet 13 was bonded temporarily on the double-sided circuit board 26, and a solder bump 14 was formed. The double-sided circuit board 26 was integrated by application of heat and pressure, and the electrical connection between layers was made, in the same way as the above examples, thereby fabricating a low thermal expansion multi-layer wiring board of six-layer structure.

Comparative Example 4

A six-layer wiring board was fabricated in the same way as in the comparative example 3, except for using the electrically conductive via 15 of the comparative example 1, instead of providing the soldered via 24 used in the comparative example 3.

A thermal shock test (liquid layer: −65° C. to 150° C., each 5 min) was conducted to make assessment of the electrical bonding reliability for each via 5, 15, 24 in the six-layer wiring board fabricated above, as described in the examples 1, 2 and the comparative examples 1 to 4. A table 1 below indicates the number of cycles at which a continuity failure has occurred in each via 5, 15, and 24. Herein, the variation in resistance beyond ±10% was considered as the continuity failure.

TABLE 1

|  | Thermal shock test (cyc.) |
| --- | --- |
| Example 1 | 1000 or more |
| Example 2 | 1000 or more |

TABLE 1-continued

| | Thermal shock test (cyc.) |
|---|---|
| Comparative example 1 | 800 |
| Comparative example 2 | 100 or less |
| Comparative example 3 | 1000 or more |
| Comparative example 4 | 200 |

As will be clear from the above table 1, a continuity failure occurred at 100 or less cycles in the comparative example 2 (a six-layer wiring board having the conventional through hole structure). On the contrary, in a six-layer wiring board as shown in the examples 1, 2 and comparative example 3 the variation in resistance of each via is maintained within ±10% up to 1000 cycles. It will be apparent that the connection reliability of the six-layer wiring board is high, in which electrical connection between each circuit 4 is made by each via 5, 24 with the soldered electric conductor 5a filled therein. As a comparison between the comparative examples 1 and 4 in which electrical connection between each circuit 4 is made by an electrically conductive via 15, the Ni—Fe alloy foil 2 as the core is used, leading to significantly increased reliability.

As a comparison among the examples 1 and 2 and the comparative example 3 where electrical connection between each circuit 4 is made by the soldered via 5, while the continuity resistance is increased after 1000 cycles in the comparative example 3, the variation in continuity resistance is maintained within ±10% even after 2000 cycles in the examples 1 and 2 where the Ni—Fe alloy foil 2 is used as the core. Since the Ni—Fe alloy foil 2 can suppress the amount of variation in the Z-axis direction around the via 15, it is considered that the reliability in any cases of the examples 1 and 2 and the comparative example 1 was improved.

Regarding the examples 1, 2 and the comparative examples 1, 3 and 4, the connection between any layers can be made by each minute via 5, 15, and 24, leading to a higher degree of freedom. As a result, it is clear that the higher wiring density can be easily realized.

Further, the insulating layer of the double-sided circuit board 1 contains a low thermal expansion core material comprising Ni—Fe alloy foil 2 at a ratio of one layer to the conductor layer 4a. The thermal expansion coefficient of the six-layer wiring board as described in the examples 1, 2 and the comparative examples 1 to 4 was measured in a range from room temperature (25° C.) to 200° C. The results were listed in a table 2 below.

TABLE 2

| | Thermal expansion coefficient (ppm/° C.) |
|---|---|
| Example 1 | 4.0 |
| Example 2 | 4.0 |
| Comparative example 1 | 4.0 |
| Comparative example 2 | 4.0 |
| Comparative example 3 | 17.0 |
| Comparative example 4 | 17.0 |

As listed in the table 2, the thermal expansion coefficients of the six-layer wiring boards in the examples 1, 2 and the comparison examples 1, 2 which use Ni—Fe alloy foil 2 as the core material are extremely small. It is clear that these six-layer wiring boards are appropriate for the bare chip mounting. In this way, it is needless to say that the low thermal expansion coefficient multi-layer wiring board is appropriate for the bare chip mounting and is highly reliable in the electrical connection.

As described above, the multi-layer wiring board of the present invention is provided with the via hole with the low melting point metal filled therein, instead of the through hole, and produces no crack inside or at the corner of the via hole in the environmental accelerated test such as temperature cycle test to be highly reliable in the electrical connection. Two double-sided circuit boards laid one on the other (adjacent up and down) can be electrically connected by providing the soldered conductor on the via hole with the low melting metal filled therein, and has a great degree of freedom of wiring. On the other hand, in the manufacturing method of the present invention, the adhesive sheet is registered and bonded temporarily on the double-sided circuit board, the bore portion in this adhesive sheet is formed with the solder bump, and the double-sided circuit boards are laminated in registration and integrated by application of heat and pressure. Therefore, a plurality of double-sided circuit boards can be integrated by application of heat and pressure at a time. Also, the electrical connection between wiring conductors can be made by application of heat and pressure at a time, irrespective of the number of layers of the wiring conductor.

What is claimed is:

1. A multi-layer wiring board, which comprises:

a plurality of double-sided circuit boards, each of the plurality of double-sided circuit boards comprising a metal core as basic substance, an insulating layer provided around the metal core, the insulating layer comprising an organic high molecular weight resin, and a wiring conductor provided on either side of the insulating layer, wherein the wiring conductors provided on the both sides of the insulating layer are electrically connected via a via hole opened in the double-sided circuit board, and the via hole is filled with a low melting point metal; and an adhesive layer provided between two adjacent double-sided circuit boards, wherein the plurality of the double-sided circuit boards are laminated via the adhesive layer as one piece, the adhesive layer has a bore opened at a predetermined position corresponding to a portion to be in direct contact with the wiring conductors between the two adjacent double-sided circuit boards, and the bore portion is provided with a soldered electric conductor, and the two double-sided circuit boards are electrically connected by the soldered electric conductor.

2. The multi-layer wiring board according to claim 1, wherein the low melting point metal is a soldered electric conductor comprising at least one kind of metal selected from Sn, Pb, Ag, Bi, Zn, Sb, and Cu.

3. The multi-layer wiring board according to claim 1, wherein the metal core is a metal foil comprising one of Fe, Ni, Al, Ti, Cu or Co, or a metal foil comprising an alloy comprising at least two of Fe, Ni, Al, Ti, Cu or Co.

4. The multi-layer wiring board according to claim 1, wherein the metal core is a Ni—Fe alloy foil, the content of Ni is 31 to 50% by weight, and the metal core has a thickness of 10 μm to 100 μm.

5. A method for manufacturing a multi-layer wiring board according to claim 1, which comprises the steps of:

preparing a plurality of double-sided circuit boards, and an adhesive sheet;

wherein each of the plurality of double-sided circuit boards comprises a metal core as basic substance, an insulating layer provided around the metal core, the insulating layer comprising an organic high molecular weight resin, and a wiring conductor provided on either side of the insulating layer, wherein the wiring conductors provided on the both sides of the insulating layer are electrically connected via a via hole opened in the double-sided circuit board, and the via hole is filled with a low melting point metal, and the adhesive sheet has a bore opened at a position corresponding to a predetermined portion of the wiring conductor of the double-sided circuit board, forming a solder bump at the bore portion by filling a solder paste into the bore portion of each adhesive sheet by printing, and fusing the solder paste by heating, after bonding temporarily the adhesive sheet; and laminating the plurality of the double-sided circuit boards as one piece via the adhesive sheet by application of heat and pressure, with the wiring conductors of each of the plurality of the double-sided circuit boards being aligned to enable the predetermined electrical connections, after forming the solder bump.

* * * * *